US012537160B2

United States Patent
Sato et al.

(10) Patent No.: US 12,537,160 B2
(45) Date of Patent: Jan. 27, 2026

(54) BEAM DETECTOR, MULTI CHARGED PARTICLE BEAM IRRADIATION APPARATUS, AND BEAM DETECTOR ADJUSTMENT METHOD

(71) Applicant: NuFlare Technology, Inc., Yokohama (JP)

(72) Inventors: Yasutaka Sato, Hachioji (JP); Kiminobu Akeno, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 266 days.

(21) Appl. No.: 18/363,072

(22) Filed: Aug. 1, 2023

(65) Prior Publication Data

US 2024/0071714 A1 Feb. 29, 2024

(30) Foreign Application Priority Data

Aug. 24, 2022 (JP) ................................ 2022-133449

(51) Int. Cl.
*H01J 37/244* (2006.01)
*H01J 37/20* (2006.01)
*H01J 37/28* (2006.01)

(52) U.S. Cl.
CPC ............ *H01J 37/20* (2013.01); *H01J 37/244* (2013.01); *H01J 37/28* (2013.01); *H01J 2237/0437* (2013.01)

(58) Field of Classification Search
CPC .......... H01J 37/20; H01J 37/28; H01J 37/244; H01J 2237/0437
See application file for complete search history.

(56) References Cited

U.S. PATENT DOCUMENTS

| | | | |
|---|---|---|---|
| 5,165,045 | A | 11/1992 | Eselun |
| 5,396,077 | A | 3/1995 | Sohda et al. |
| 8,284,121 | B2 | 10/2012 | Kim et al. |
| 8,330,103 | B2 | 12/2012 | Enyama et al. |
| 10,283,316 | B2 | 5/2019 | Yamashita et al. |

(Continued)

FOREIGN PATENT DOCUMENTS

| | | | |
|---|---|---|---|
| JP | 6-275500 | A | 9/1994 |
| JP | 10-261566 | A | 9/1998 |

(Continued)

OTHER PUBLICATIONS

Korean Office Action issued Feb. 17, 2025 in Korean Patent Application No. 10-2023-0072819 (with unedited computer-generated English Translation), 10 pages.

(Continued)

*Primary Examiner* — Sean M Luck
(74) *Attorney, Agent, or Firm* — Oblon, McClelland, Maier & Neustadt, L.L.P.

(57) ABSTRACT

According to one embodiment, a beam detector includes a first aperture substrate including a first passage hole smaller than a pitch between beams of a multi charged particle beam, a second aperture substrate including a second passage hole allowing one detection target beam which has passed through the first passage hole, and a sensor detecting a beam current of the detection target beam which has passed through the second passage hole. The second aperture substrate has light permeability, and includes a conductive material.

15 Claims, 4 Drawing Sheets

(56) References Cited

U.S. PATENT DOCUMENTS

| | | | | |
|---|---|---|---|---|
| 10,347,460 | B2 * | 7/2019 | Zhao | H01J 37/1475 |
| 10,714,311 | B2 | 7/2020 | Goshima et al. | |
| 2014/0014850 | A1 * | 1/2014 | Wieland | B82Y 40/00<br>250/396 R |

FOREIGN PATENT DOCUMENTS

| | | | |
|---|---|---|---|
| JP | 3274212 | B2 | 2/2002 |
| JP | 2005-340229 | A | 12/2005 |
| JP | 2005347054 | A | 12/2005 |
| JP | 2009-9882 | A | 1/2009 |
| JP | 6834817 | B2 | 2/2021 |
| JP | 7074639 | B2 | 5/2022 |
| KR | 10-0670344 | B1 | 1/2007 |
| KR | 10-2008-0002053 | A | 1/2008 |
| KR | 10-2018-0016942 | A | 2/2018 |

OTHER PUBLICATIONS

Notice of Allowance issued Oct. 14, 2025 in Korean Patent Application No. 10-2023-0072819, with computer generated English translation, citing documents 1-4 therein.

* cited by examiner

BEAM DETECTOR, MULTI CHARGED PARTICLE BEAM IRRADIATION APPARATUS, AND BEAM DETECTOR ADJUSTMENT METHOD

CROSS REFERENCE TO RELATED APPLICATION

This application is based upon and claims benefit of priority from the Japanese Patent Application No. 2022-133449, filed on Aug. 24, 2022, the entire contents of which are incorporated herein by reference.

FIELD

The present invention relates to a beam detector, a multi charged particle beam irradiation apparatus, and a beam detector adjustment method.

BACKGROUND

With wafer-scale integration of LSIs, the circuit line widths of semiconductor devices have become finer and finer. As a method of forming exposure masks (also referred to as reticles when used in steppers or scanners) for forming circuit patterns onto these semiconductor devices, an electron beam writing technology having an excellent resolution is used.

As an electron beam writing apparatus, a writing apparatus using multiple beams has been developed. With use of multiple beams, irradiation can be made by using a larger number of beams than the case of using one electron beam to perform writing, and hence a throughput can be greatly increased. In a multi beam writing apparatus, for example, an electron beam emitted from an electron gun is passed through an aperture member with holes to form multiple beams, blanking control is performed for each of the beams with a blanking aperture array plate, and the beams that have not been shielded are reduced in diameters by an optical system and are applied to a substrate placed on a movable stage.

In order to maintain the irradiation position of a multi-beam on a substrate at high accuracy, it is important to recognize the position, on the substrate, of each beam included in the multi-beam with high accuracy. In a configuration in which the number of beams is small, for example, several, and the pitch between beams is sufficiently large, marks for beams, which are the same in number as the number of beams, are placed on a stage, and the positions of the beams can be measured by scanning the marks corresponding to the beams (for example, see Japanese Unexamined Patent Application Publication No. 2009-9882).

However, along with miniaturization of circuit patterns, a multi-beam with a greater number of beams is necessary to significantly improve the throughput. As the number of beams increases, the beam diameter reduces, and the pitch between beams decreases. Along with reduction in the pitch between beams due to an increased number of beams like this, it is not easy to individually detect each beam from a radiated multi-beam one by one using a mark disposed on a stage.

An individual beam detector has been proposed, which uses an aperture of a thin film having a passage hole to detect one detection target beam which passes through the passage hole by a sensor such as a photodiode, the passage hole being smaller than the pitch between beams of the multi-beam and larger in size than the beam diameter. However, with such an individual beam detector, scattered electrons may enter the sensor, generating a noise source, and the detection accuracy may be reduced, the scattered electrons being produced by passage of beams in the vicinity of the detection target beam through a thin film aperture. In order to block the scattered electrons, a second aperture may be provided between the thin film aperture (first aperture) and the sensor; however, the hole of the thin film aperture and a hole of the second aperture are both microscopic holes, and alignment of the holes is difficult.

DETAILED DESCRIPTION

According to one embodiment, a beam detector includes a first aperture substrate including a first passage hole smaller than a pitch between beams of a multi charged particle beam, a second aperture substrate including a second passage hole allowing one detection target beam which has passed through the first passage hole, and a sensor detecting a beam current of the detection target beam which has passed through the second passage hole. The second aperture substrate has light permeability, and includes a conductive material.

Figure 1:
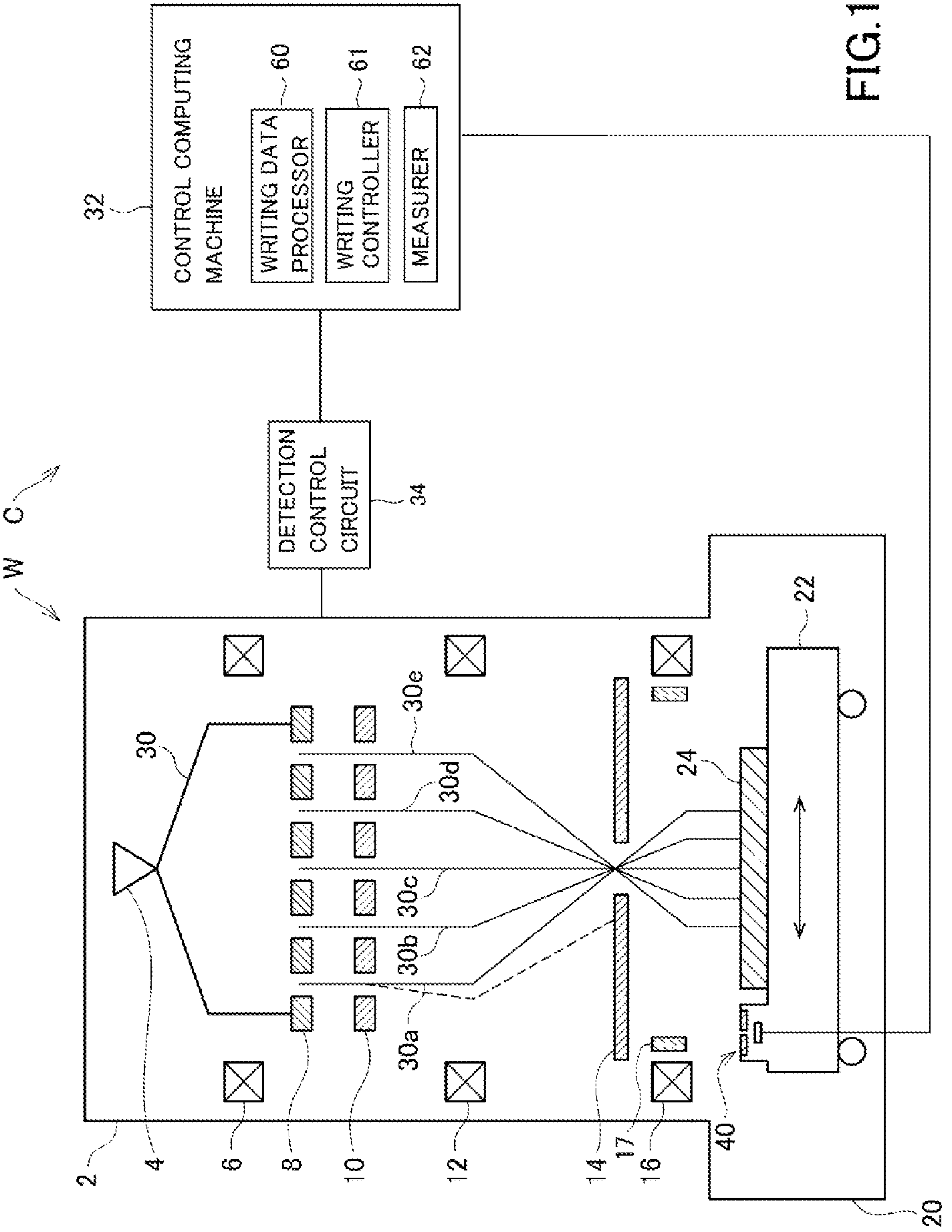
FIG. 1 is a schematic view of a multi charged particle beam writing apparatus according to an embodiment of the present invention.

FIG. 1 is a schematic view of a multi charged particle beam writing apparatus according to an embodiment of the present invention. In this embodiment, a configuration using an electron beam as an example of a charged particle beam will be described. However, the charged particle beam is not limited to the electron beam, and may be another charged particle beam such as an ion beam.

The writing apparatus includes a writer W that writes a desired pattern on a substrate 24 as a writing target by irradiating it with an electron beam; and a controller C that controls the operation of the writer W.

The writer W includes an electron beam column 2, and a writing chamber 20. In the electron beam column 2, an electron gun 4, an illumination lens 6, a shaping aperture array substrate 8, a blanking aperture array substrate 10, a reduction lens 12, a limiting aperture member 14, an objective lens 16 and a deflector 17 are disposed.

In the writing chamber 20, an XY stage 22 is disposed. A substrate 24 as a writing target is disposed on the XY stage 22. The substrate 24 as a writing target may refer to, for example, a wafer and an exposure mask to transfer a pattern to a wafer using a reduction projection exposure apparatus or an extreme ultraviolet exposure apparatus (EUV), such as a stepper and a scanner, which utilizes an excimer laser as a light source.

In addition, a transmissive mark individual beam detector 40 is disposed on the XY stage 22 at a position different from the position where the substrate 24 is placed. The height of the individual beam detector 40 is adjustable by an adjustment mechanism (not illustrated). The upper surface of the individual beam detector 40 is preferably installed at the same height position as the surface of the substrate 24.

The controller C has a control computing machine 32 and a deflection control circuit 34.

The control computing machine 32 has a writing data processor 60, a writing controller 61 and a measurer 62. The components of the control computing machine 32 may be comprised of hardware such as an electrical circuit, or software such as a program to implement these functions. When the components are comprised of software, a program to implement these functions may be stored in a recording medium, read into a computer including a CPU or the like, and executed by the computer.

Writing data converted from design data (layout data) to a format for the writing apparatus is stored in a storage device which is not illustrated. The writing data processor 60 reads the writing data from the storage device, and performs a multi-stage data conversion process to generate shot data. The shot data is generated for each pixel, and a writing time (irradiation time) is calculated. For example, when a pattern is not formed in target pixels, no beam irradiation is performed, thus an identification code for writing time zero or no beam irradiation is defined. Here, a maximum writing time T (maximum exposure time) in a single multi-beam shot is set in advance. The irradiation time of each beam actually radiated is preferably determined in proportion to the areal density of a calculated pattern. The finally calculated irradiation time of each beam is preferably a time corresponding to an irradiation amount after correction is made in terms of irradiation amount on a dimensional variation due to a dimensional variation causing phenomenon, such as a proximity effect, a fogging effect, and a loading effect which are not illustrated. Thus, the irradiation time of each beam actually radiated varies with each beam. The writing time (irradiation time) of each beam is calculated as a value less than or equal to the maximum writing time T. The writing data processor 60 generates irradiation time arrangement data for each shot of multi-beam using calculated irradiation time data of pixels as data for beam to write the pixels, the irradiation time arrangement data being arranged in an arrangement order of the beams in the multi-beam.

The writing controller 61 uses the irradiation time arrangement data (shot data) to output a control signal for causing the deflection control circuit 34, and a control circuit (not illustrated) that drives the writer W to perform a writing process. The writer W writes a desired pattern on the substrate 24 using a multi-beam based on the control signal. Specifically, the writer W operates as follows.

Figure 2:
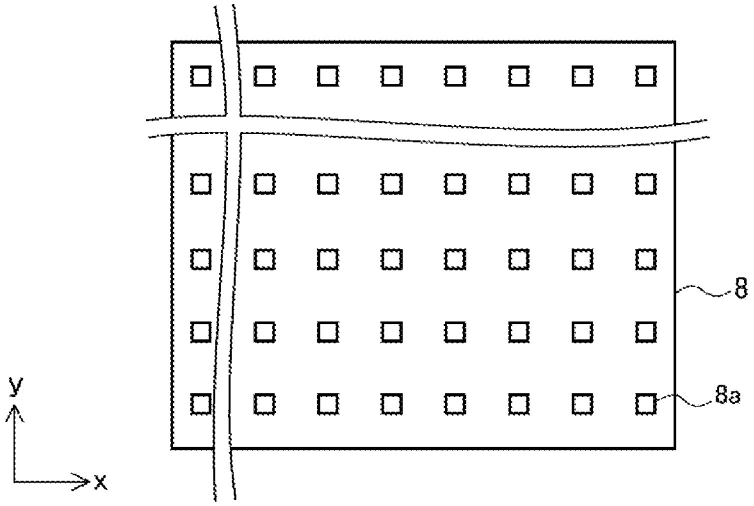
FIG. 2 is a schematic view of a shaping aperture array substrate.

An electron beam 30 emitted from the electron gun 4 illuminates the shaping aperture array substrate 8 in its entirety substantially perpendicularly by the illumination lens 6. FIG. 2 is a conceptual view illustrating the configuration of the shaping aperture array substrate 8. In the shaping aperture array substrate 8, openings 8*a* are formed in vertical (y direction) m rows×horizontal (x direction) n columns (m, n≥2) in a matrix with a predetermined arrangement pitch. For example, the openings 8*a* in 512 rows×512 columns are formed. The openings 8*a* are formed as rectangles having the same dimensional shape. The openings 8*a* may be circular with the same diameter.

The electron beam 30 illuminates an area including all openings 8*a* of the shaping aperture array substrate 8. Part of the electron beam 30 passes through these multiple openings 8*a*, thereby forming multi-beams 30*a* to 30*e* as illustrated in FIG. 1.

In the blanking aperture array substrate 10, through-holes are formed based on the arrangement positions of the openings 8*a* of the shaping aperture array substrate 8, and in each through-hole, a blanker consisting of two electrodes forming a pair is disposed. The electron beams 30*a* to 30*e* which have passed through the through-holes are each independently deflected by a voltage applied to a corresponding blanker. Each beam is blanking-controlled by the deflection. Blanking deflection is performed by the blanking aperture array substrate 10 on the beams in the multi-beam, which have passed through the plurality of openings 8*a* of the shaping aperture array substrate 8.

The multi-beams 30*a* to 30*e* which have passed through the blanking aperture array substrate 10 are reduced in beam size and arrangement pitch by the reduction lens 12, and travel to the central opening formed in the limiting aperture member 14. An electron beam deflected by a blanker of the blanking aperture array substrate 10 changes its trajectory, and is displaced from the opening in the center of the limiting aperture member 14, and blocked by the limiting aperture member 14. In contrast, an electron beam not deflected by the blankers of the blanking aperture array substrate 10 passes through the opening in the center of the limiting aperture member 14.

The limiting aperture member 14 blocks those electron beams that are deflected by the blankers of the blanking aperture array substrate 10 to achieve a beam-OFF state. The electron beam for one shot is given by the beam which has passed through the limiting aperture member 14 during a time from beam ON to beam OFF.

The electron beams 30*a* to 30*e* which have passed through the limiting aperture member 14 are focused by the objective lens 16, and form a pattern image with a desired reduction ratio on the substrate 24. The electron beams (the entire multi-beam) which have passed through the limiting aperture member 14 are collectively deflected by the deflector 17 in the same direction, and are radiated to the substrate 24.

The multi-beams radiated at one time are ideally arranged with the pitch which is the product of the arrangement pitch of the plurality of openings 8*a* of the shaping aperture array substrate 8 and the above-mentioned desired reduction ratio. The writing apparatus performs a writing operation by a raster scan method for irradiating with a shot beam sequentially, and when a desired pattern is written, needed beams are controlled at beam-ON by blanking control according to the pattern. When the XY stage 22 is continuously moved, the irradiation position of the beam is controlled by the deflector 17 so as to follow the movement of the XY stage 22.

Such a writing apparatus needs to individually recognize the irradiation position of each beam included in the multi-beam in order to improve the writing accuracy. Thus, the position of each beam is detected using the individual beam detector 40.

Figure 3:
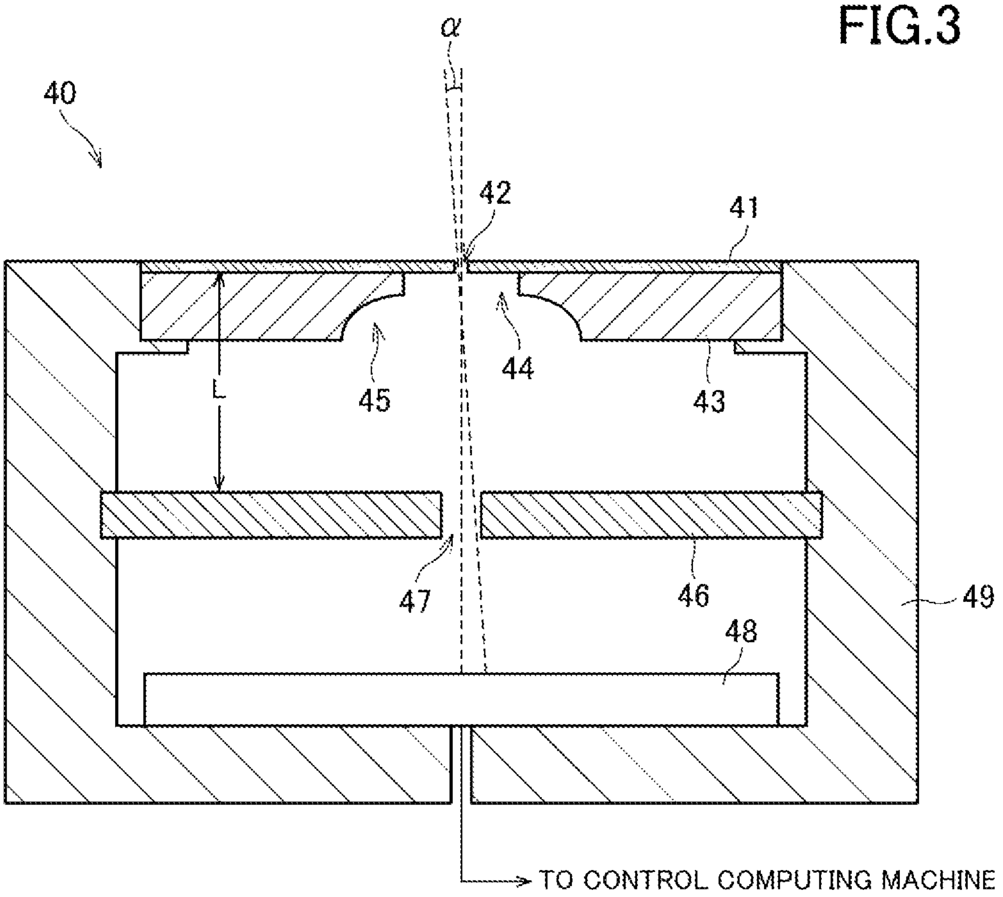
FIG. 3 is a schematic configuration view of an individual beam detector.

FIG. 3 is a schematic configuration view of the transmissive mark individual beam detector 40. The individual beam detector 40 has a first aperture substrate 41, a support table 43, a second aperture substrate 46, a sensor 48 and a housing 49.

The first aperture substrate 41 (thin film) has one micropore 42 (first passage hole) formed in the center thereof. The first aperture substrate 41 is formed of a thin film with a thickness, through which a multi-beam is transmissive. Specifically, the first aperture substrate 41 is formed as a thin-film flat plate, for example, with a film thickness of 300 to 1000 nm using a heavy metal material. More preferably, the first aperture substrate 41 should be formed with a thickness of approximately 500 nm±50 nm. For example, an electron beam emitted at an acceleration voltage of 50 keV cannot be absorbed by the first aperture substrate 41, and transmits therethrough.

When the first aperture substrate 41 is heated by using a thin film structure for it, heat transfer from the heated position to its periphery is unlikely to occur, and heat radiation can be reduced. For example, platinum (Pt), gold (Au) or tungsten (W) is preferable as the heavy metal material. Even when the film thickness is made thinner, use of heavy metal allows the number of transmitted electrons to be reduced when a multi-beam is radiated.

The micropore 42 is formed with a diameter size φ1 which is larger than the beam diameter of individual beam in a multi-beam including electron beams, and smaller than the pitch between beams. For example, when the pitch between beams in a multi-beam is approximately 150 to 200 nm, the micropore 42 is formed as a hole having a diameter φ1 of approximately 80 to 120 nm, for example. Making the diameter of the micropore 42 larger than the beam diameter of an individual beam and smaller than the pitch between beams prevents multiple beams from passing through the micropore 42 simultaneously even when a multi-beam is scanned.

The first aperture substrate 41 is supported by the support table 43. In the support table 43, an opening 44 is formed below an area including the micropore 42 in the first aperture substrate 41. In the example of FIG. 3, the opening 44 is formed in the center. The diameter size φ2 (width size) of the opening 44 is formed with a size so that when a multi-beam is radiated to the first aperture substrate 41, the temperature of the periphery of the micropore 42 in the first aperture substrate 41 is higher than the evaporation temperature of impurities (contamination) adhering to the periphery. The evaporation temperature of contamination is preferably 100° C. or higher, for example. For example, the diameter size φ2 of the opening 44 is approximately 8 to 10 μm.

As the material for the support table 43, for example, molybdenum (Mo), platinum (Pt), tantalum (Ta) or silicon (Si) is preferably used. The thickness of the support table 43 can block the electron beams included in a radiated multi-beam without allowing transmission of the electron beams. For example, a thickness of 15 μm or more can block an electron beam accelerated at 50 key.

In the periphery of the opening 44 on the rear surface side of the support table 43, an opening 45 is further provided, which is formed with a thickness to the extent which does not allow electrons to transmit, thus, in the vicinity of the periphery of the opening 44, the heat transmitted from the first aperture substrate 41 to the support table 43 can be made unlikely to be transmitted in a horizontal direction. As a result, the temperature of the area, above the opening 44, near the micropore 42 of the first aperture substrate 41 can be further prevented from dropping.

The outer peripheral size of the support table 43 is formed to be equal to or greater than the outer periphery of the first aperture substrate 41, for example. The bottom surface of the support table 43 is supported by the housing 49.

The second aperture substrate 46 is disposed between the first aperture substrate 41 and the sensor 48. The second aperture substrate 46 has one micropore 47 (second passage hole) formed in the center thereof. The outer periphery of the second aperture substrate 46 is fixed by the housing 49.

When the first aperture substrate 41 is scanned by a multi-beam, of a group of beams emitted to the area above the opening 44, one detection target beam passes through the micropore 42, and other beams transmit the first aperture substrate 41, and are scattered from the rear surface side of the first aperture substrate 41. In contrast, of the multi-beam, a group of beams emitted to the region other than the area above the opening 44 is blocked by the support table 43.

The detection target beam which has passed through the micropore 42 passes through the micropore 47 of the second aperture substrate 46, and reaches the light receiving surface of the sensor 48. In contrast, the electrons scattered from the rear surface side of the first aperture substrate 41 are blocked by the second aperture substrate 46, and prevented from reaching the light receiving surface of the sensor 48.

The sensor 48 is, for example, a semiconductor solid-state detector (SSD), and detects the beam current of the detection target beam. A result of detection by the sensor 48 is notified to the control computing machine 32. The measurer 62 obtains the beam current of each beam from the sensor 48 by scanning the first aperture substrate 42 with a multi-beam. The measurer 62 converts the beam current to brightness, produces a beam image based on the amount of deflection of the deflector 17, and obtains information on the shape of the multi-beam in its entirety. The amount of irradiation of each beam is corrected based on the information.

Let α [radian] be the imaging landing angle of the detection target beam, and L be the distance between the surface (the upper surface) of the first aperture substrate 41 and the surface (the upper surface) of the second aperture substrate 46, then the diameter of the micropore 47 is preferably 2×α×L or greater so that the beam which has passed through the micropore 42 passes through the micropore 47 and reaches the light receiving surface of the sensor 48. For example, the diameter of the micropore 47 is approximately 250 μm.

From the view point of prevention of electrostatic charge, the material for the second aperture substrate 46 preferably has an electrical conductivity. The material preferably has an electrical conductivity such that Ii=Io, where Ii indicates charged particles incident on the second aperture substrate 46, and Io indicates charged particles released. Here, Io includes reflected electrons and secondary electrons.

In addition, the material for the second aperture substrate 46 is preferably a transparent material with a flat surface, through which observation light is transmissive, the observation light being used in the later-described alignment process for the hole positions of the micropore 42 of the first aperture substrate 41 and the micropore 47 of the second aperture substrate 46. The observation light may be infrared light, ultraviolet light, in addition to visible light. The thickness of the second aperture substrate 46 is thick enough to block scattered electrons.

Next, an alignment (axial alignment) method for the hole positions of the micropore 42 of the first aperture substrate 41 and the micropore 47 of the second aperture substrate 46 will be described. The alignment process is performed outside the writing apparatus.

Figure 4:
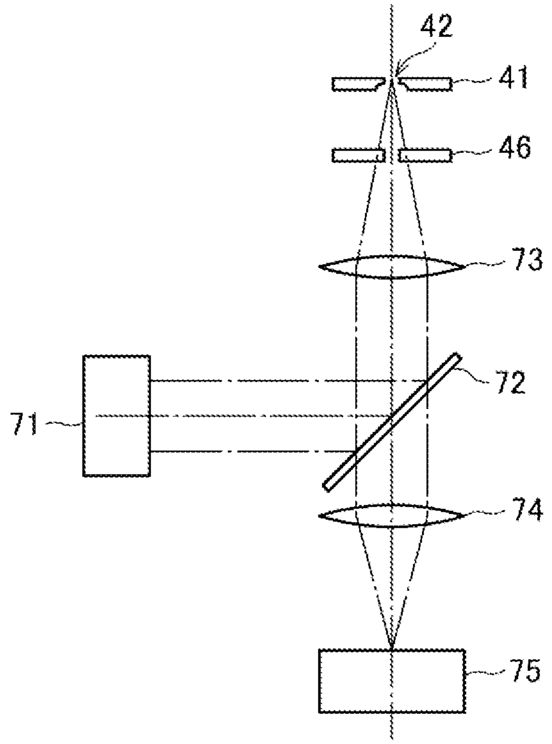
FIG. 4 is a view for explaining a method of aligning holes of two-stage aperture.

As illustrated in FIG. 4, for the alignment process, an epi-illumination unit is used, the epi-illumination including a light source (light irradiator) 71 to irradiate with light, a half mirror 72, an objective lens 73, an imaging lens 74, and an image sensor 75.

For example, when visible light with a wavelength of 400 to 800 nm is emitted from the light source 71, as the material for the second aperture substrate 46, it is possible to use a material obtained by forming an observation light-transmissive conductive film on visible light-transmissive quartz, crown glass or borosilicate glass. The conductive film may be a non-magnetic conductive material.

The observation light emitted from the light source 71 is reflected by the half mirror 72 disposed at an angle of 45° with respect to the optical axis, passes through the objective lens 73, and is radiated to an observation target (the first aperture substrate 41 and the second aperture substrate 46). The second aperture substrate 46 is located between the objective lens 73 and the first aperture substrate 41. In addition, the support table 43 is mounted on the first aperture substrate 41.

The light reflected by the observation target passes through the objective lens 73, then transmits the half mirror 72, and forms an image on the image sensor 75 by the imaging lens 74. The image sensor 75 is, for example, a CMOS image sensor.

First, the position of the objective lens 73 is adjusted, and the objective lens 73 is focused on the first aperture substrate 41. An image detected by the image sensor 75 is observed, the imaging position of the micropore 42 is identified, and the identified position is set as a reference mark. It is sufficient that visible light can transmit through the second aperture substrate 46 as needed to identify the imaging position of the micropore 42.

Figure 5:
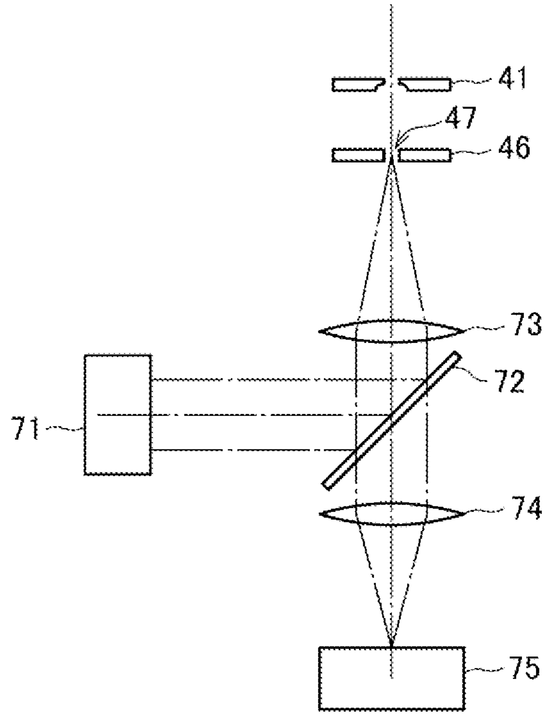
FIG. 5 is a view for explaining a method of aligning holes of two-stage aperture.

Next, as illustrated in FIG. 5, the position of the objective lens 73 is adjusted to focus it on the second aperture substrate 46. The second aperture substrate 46 is moved in a plane direction perpendicular to the optical axis using a movement mechanism not illustrated so that the imaging position of the micropore 47 of the second aperture substrate 46 matches the above-mentioned reference mark.

When the imaging position of the micropore 47 of the second aperture substrate 46 matches the reference mark, the micropore 42 of the first aperture substrate 41 and the micropore 47 of the second aperture substrate 46 are aligned with high accuracy.

When the alignment is completed, the first aperture substrate 41, the support table 43, the second aperture substrate 46, and the sensor 48 are fixed by the housing 49, thus the individual beam detector 40 with the micropore 42 and the micropore 47 aligned with each other is produced. The individual beam detector 40 is mounted on the writing apparatus.

In this manner, according to this embodiment, highly accurate alignment can be performed on the micropores 42, 47 of the two-stage aperture substrate consisting of the first aperture substrate 41 and the second aperture substrate 46.

Figure 6:
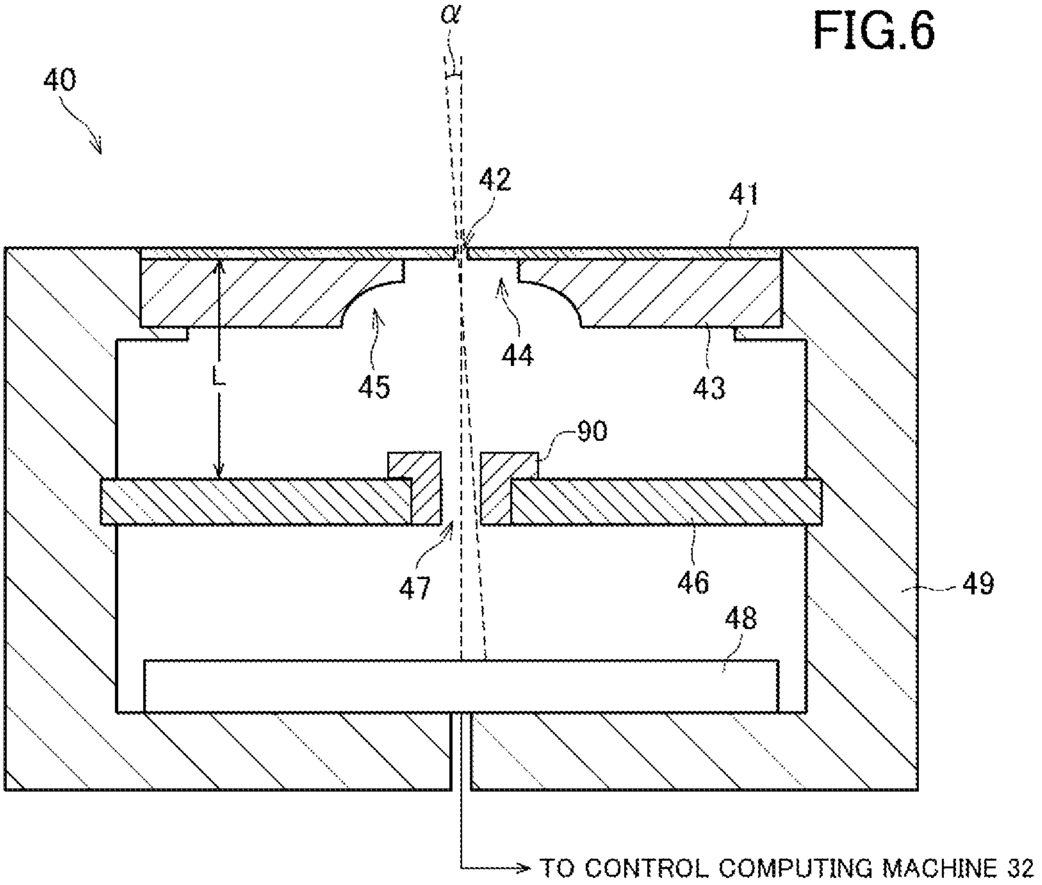
FIG. 6 is a schematic configuration view of an individual beam detector.

In the above embodiment, an example has been described, in which as the material for the second aperture substrate 46, a material is used, obtained by forming an observation light-transmissive conductive film on a visible light-transmissive optical glass, the visible light being observation light emitted from the light source 71. As illustrated in FIG. 6, the peripheral edge of the micropore 47 of the second aperture substrate 46 may be composed of a non-magnetic conductive material 90. In other words, a micropore may be fabricated in the non-magnetic conductive material 90. As the non-magnetic conductive material 90, titanium, copper, titanium alloy, and copper alloy may be mentioned. In particular, titanium is a material on which machining and FIB machining are easily performed, and when the micropore 47 is fabricated, precise hole diameter control is possible. The non-magnetic conductive material 90 surrounds the periphery of the micropore 47.

When the observation light emitted from the light source 71 is infrared light (wavelength of 1100 to 1500 nm), the material for the second aperture substrate 46 may be silicon crystals or sapphire crystals. In this situation, for example, an InGaAs image sensor is used as the image sensor 75.

In the above embodiment, a multi-beam writing apparatus has been described as an example of an apparatus on which an individual beam detector is mounted; however, the embodiment is not limited to this. For example, an individual beam detector can be similarly mounted on an apparatus that irradiates with a multi-beam, such as an inspection apparatus that inspects a defect of a pattern. In addition, the invention is also applicable to an apparatus that irradiates with a single beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A beam detector comprising:

a first aperture substrate including a first passage hole smaller than a pitch between beams of a multi charged particle beam;

a second aperture substrate including a second passage hole allowing one detection target beam which has passed through the first passage hole; and a sensor detecting a beam current of the detection target beam which has passed through the second passage hole, wherein the second aperture substrate has light permeability, and includes a conductive material.

2. The detector according to claim 1, wherein the first passage hole has a size larger than a beam diameter of an individual beam.

3. The detector according to claim 1, wherein the second aperture substrate includes a non-magnetic conductive material provided in a peripheral edge of the second passage hole.

4. The detector according to claim 3, wherein the non-magnetic conductive material contains titanium or copper.

5. The detector according to claim 1, wherein the second aperture substrate includes: a light transmissive transparent material; and a light transmissive conductive film formed in the transparent material, the conductive film being a non-magnetic conductive material.

6. The detector according to claim 1, wherein a diameter of the second passage hole is greater than or equal to $2\times\alpha\times L$, where $\alpha$ is an imaging landing angle of the detection target beam, and L is a distance between an upper surface of the first aperture substrate and an upper surface of the second aperture substrate.

7. A multi charged particle beam irradiation apparatus comprising:

a stage on which a writing target substrate is placed;

an emitter emitting a charged particle beam;

a shaping aperture array substrate receiving irradiation of the charged particle beam, and forming a multi-beam by allowing part of the charged particle beam;

an optical system radiating the multi-beam onto the writing target substrate; and a beam detector disposed on the stage individually detecting beams in the multi-beam, wherein the beam detector includes:

a first aperture substrate including a first passage hole smaller than a pitch between beams of the multi-beam;

a second aperture substrate including a second passage hole allowing one detection target beam which has passed through the first passage hole; and a sensor detecting a beam current of the detection target beam which has passed through the second passage hole, wherein the second aperture substrate has light permeability, and includes a conductive material.

8. The apparatus according to claim 7, wherein the first passage hole has a size larger than a beam diameter of an individual beam.

9. The apparatus according to claim 7, wherein the second aperture substrate includes a non-magnetic conductive material provided in a peripheral edge of the second passage hole.

10. The apparatus according to claim 9, wherein the non-magnetic conductive material contains titanium or copper.

11. The apparatus according to claim 7, wherein the second aperture substrate includes: a light transmissive transparent material; and a light transmissive conductive film formed in the transparent material, the conductive film being a non-magnetic conductive material.

12. The apparatus according to claim 7, wherein a diameter of the second passage hole is greater than or equal to $2 \times \alpha \times L$, where $\alpha$ is an imaging landing angle of the detection target beam, and L is a distance between an upper surface of the first aperture substrate and an upper surface of the second aperture substrate.

13. A beam detector adjustment method to align a first passage hole formed in a first aperture substrate with a second passage hole formed in a second aperture substrate, the first passage hole being smaller than a pitch between beams of a multi charged particle beam, the second passage hole allowing one detection target beam of the multi charged particle beam, the method comprising:

radiating light emitted from a light source to the first aperture substrate through the second aperture substrate, focusing an objective lens to the first aperture substrate, observing image formation of reflected light incident through the objective lens using an image sensor, and setting a position of the first passage hole as a reference mark; and focusing the objective lens to the second aperture substrate, observing image formation of reflected light incident through the objective lens using the image sensor, and moving the second aperture substrate so that a position of the second passage hole matches the reference mark.

14. The detector adjustment method according to claim 13, wherein when the light emitted from the light source is visible light with a wavelength of 400 to 800 nm, the second aperture substrate includes: a transparent material containing quartz, crown glass or borosilicate glass, through which the visible light is transmissive; and a conductive film which is formed in the transparent material, and through which the visible light is transmissive, the conductive film being a non-magnetic conductive material.

15. The detector adjustment method according to claim 13, wherein when the light emitted from the light source is infrared light, the second aperture substrate contains silicon crystals or sapphire crystals.

* * * * *